(12) United States Patent
Shih

(10) Patent No.: US 9,741,687 B2
(45) Date of Patent: Aug. 22, 2017

(54) INTEGRATED CIRCUIT STRUCTURE WITH ACTIVE AND PASSIVE DEVICES IN DIFFERENT TIERS

(71) Applicant: Taiwan Semiconductor Manufacturing Company, Ltd., Hsin-Chu (TW)

(72) Inventor: Yu-Nan Shih, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/151,722

(22) Filed: May 11, 2016

(65) Prior Publication Data

US 2016/0254248 A1    Sep. 1, 2016

Related U.S. Application Data

(62) Division of application No. 14/021,923, filed on Sep. 9, 2013, now Pat. No. 9,355,892.

(51) Int. Cl.
  *H01L 21/44* (2006.01)
  *H01L 21/48* (2006.01)
  (Continued)

(52) U.S. Cl.
  CPC .... *H01L 25/0652* (2013.01); *H01L 21/76805* (2013.01); *H01L 23/481* (2013.01);
  (Continued)

(58) Field of Classification Search
  CPC ... H01L 25/162; H01L 21/52; H01L 25/0652; H01L 25/50; H01L 21/76805;
  (Continued)

(56) References Cited

U.S. PATENT DOCUMENTS

2007/0096263 A1    5/2007 Furukawa et al.
2011/0111591 A1*  5/2011 Do .................... H01L 21/6835
                                                              438/667
(Continued)

OTHER PUBLICATIONS

Liu, C., et al., "A Design Tradeoff Study with Monolithic 3D Integration", 13th Int'l Symposium on Quality Electronic Design, 2012, IEEE, 8 pages.

(Continued)

*Primary Examiner* — Thien F Tran
(74) *Attorney, Agent, or Firm* — Slater Matsil, LLP

(57) ABSTRACT

An integrated circuit structure includes a two-tier die including a first tier and a second tier over and bonded to the first tier. The first tier includes a first substrate including a semiconductor material, an active device at a surface of the first substrate, and a first interconnect structure over the first substrate, wherein the first tier is free from passive devices therein. The second tier includes a second substrate bonded to and in contact with the first interconnect structure, and a second interconnect structure over the second substrate, wherein metal lines in the second interconnect structure are electrically coupled to the first interconnect structure. The second tier further includes a plurality of through-vias penetrating through the second substrate, wherein the plurality of through-vias lands on metal pads in a top metal layer of the first interconnect structure, and a passive device in the second interconnect structure.

20 Claims, 5 Drawing Sheets

(51) Int. Cl.
*H01L 21/50* (2006.01)
*H01L 25/065* (2006.01)
*H01L 21/768* (2006.01)
*H01L 23/48* (2006.01)
*H01L 23/522* (2006.01)
*H01L 25/00* (2006.01)
*H01L 25/16* (2006.01)

(52) U.S. Cl.
CPC ........ *H01L 23/5223* (2013.01); *H01L 25/065* (2013.01); *H01L 25/0657* (2013.01); *H01L 25/16* (2013.01); *H01L 25/50* (2013.01); *H01L 2224/11* (2013.01); *H01L 2225/06527* (2013.01); *H01L 2225/06537* (2013.01); *H01L 2225/06541* (2013.01); *H01L 2225/06544* (2013.01); *H01L 2225/06555* (2013.01); *H01L 2225/06565* (2013.01); *H01L 2225/06586* (2013.01); *H01L 2924/0002* (2013.01)

(58) Field of Classification Search
CPC . H01L 23/481; H01L 23/5223; H01L 25/065; H01L 25/0657; H01L 25/16
USPC .................................................. 438/107, 667
See application file for complete search history.

(56) References Cited

U.S. PATENT DOCUMENTS

2013/0043584 A1* 2/2013 Kwon ............... H01L 23/49822
257/737
2013/0094157 A1 4/2013 Giuliano

OTHER PUBLICATIONS

Sekar, D., et al., "Monolithic 3D-ICs with Single Crystal Silicon Layers," 2011 IEEE International 3D Systems Integration Conference (3DIC), Jan. 31-Feb. 2, 2012, 2 pages.

* cited by examiner

US 9,741,687 B2

INTEGRATED CIRCUIT STRUCTURE WITH ACTIVE AND PASSIVE DEVICES IN DIFFERENT TIERS

PRIORITY CLAIM AND CROSS-REFERENCE

This application is a divisional of U.S. patent application Ser. No. 14/021,923, entitled "Integrated Circuit Structure with Active and Passive Devices in Different Tiers," filed on Sep. 9, 2013, which application is incorporated herein by reference.

BACKGROUND

In the manufacturing of integrated circuits, circuit devices such as transistors are first formed on a semiconductor substrate. An interconnect structure including metal lines and vias is then formed to connect the circuit devices as functional circuits. To form the interconnect structure, a plurality of dielectric layers are formed, and the metal lines and vias are formed in the dielectric layers.

As the semiconductor industry introduces new generations of Integrated Circuits (IC) having higher performance and more functionality, the density of the elements forming the ICs increases, while the dimensions, sizes, and spacing between components or elements are reduced. In the past, such reductions were limited only by the ability to define the structures photo-lithographically, and device geometries having smaller dimensions create new limiting factors. For example, for any two adjacent conductive features, as the distance between the conductive features decreases, the resulting capacitance (a function of the dielectric constant (k value) of the insulating material divided by the distance between the conductive features) increases. This increased capacitance results in increased power consumption and increased resistive-capacitive (RC) delay. Therefore, the continual improvement in semiconductor IC performance and functionality is dependent upon developing materials with low k values.

The reduction in the k value, however, conflicts with the requirements of other devices such as capacitors. The capacitance of a capacitor is proportional to the k value of the capacitor insulator between the capacitor plates. Accordingly, with the reduction in the k value, it is difficult to form capacitors with high capacitance values.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A two-tier chip with active devices and passive devices separated to different tiers is provided in accordance with various exemplary embodiments. The variations of the embodiments are discussed. Throughout the various views and illustrative embodiments, like reference numbers are used to designate like elements.

Figure 1:
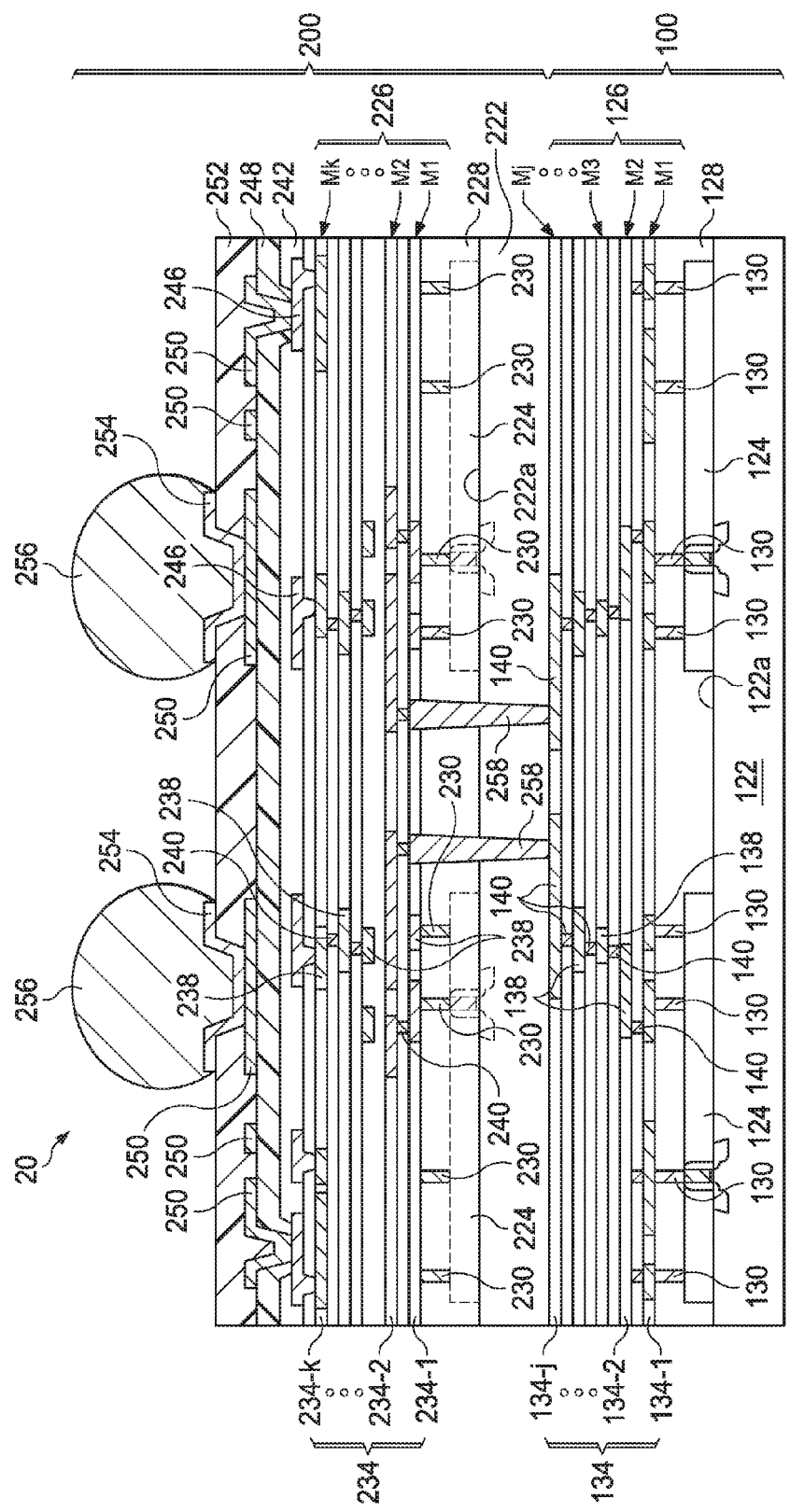
FIG. 1 schematically illustrates a cross-sectional view of a two-tier chip in accordance with some exemplary embodiments.

Referring to FIG. 1, chip 20 includes first tier 100 and second tier 200 over first tier 100. First tier 100 includes semiconductor substrate 122 and integrated circuits 124 formed at a surface of semiconductor substrate 122. In accordance with some embodiments, integrated circuits 124 include active devices such as transistors, diodes, or the like, wherein a transistor is schematically illustrated in integrated circuits 124. Semiconductor substrate 122 may be a silicon substrate, although it may be formed of other semiconductor materials such as silicon germanium, silicon carbon, III-V compound semiconductors, and/or the like. Semiconductor substrate 122 may also be a bulk substrate or a Semiconductor-On-Insulator (SOI) substrate. Integrated circuits 124 may be formed at the front surface 122a of substrate 122.

Interconnect structure 126 is formed over substrate 122. Interconnect structure 126 may include Inter-Layer Dielectric (ILD) 128 (in which the electrodes of transistor are located) and contact plugs 130 in ILD 128, wherein contact plugs 130 may be formed of tungsten or other metallic materials.

Furthermore, interconnect structure 126 includes Inter-Metal Dielectrics (IMDs) 134, and metal lines/pads 138 and vias 140 in IMDs 134. IMDs 34 may be formed of low-k dielectric materials having low k values that are, for example, lower than about 2.5, or even lower than about 2.0. With the low k values, the parasitic capacitance of metal lines 138 is reduced, and the performance of integrated circuits 124 (and the active devices therein) is improved. Interconnect structure 126 may include a bottom metal layer (commonly known as M1) and a top metal layer Mj (with j being a positive integer), and a plurality of metal layers therebetween, including the metal layer (M2) immediately over M1, the metal layer (M3) immediately over M2, M4, M5, etc, all the way to Mj. Metal vias 140 interconnect metal layers M1 through Mj. Throughout the description, the term "metal layer" refers to the collection of all metal lines and pads in the same dielectric layer, with metal vias interconnecting the metal layers. Positive integer j may be any positive value ranging, for example, from 3 to 10 (or greater), depending on how many layers are needed. Metal lines/pad 138 and vias 140 may be electrically coupled to semiconductor devices 124. Metal lines/pad 138 and vias 140 may be formed of copper or copper alloys, and may be formed using damascene processes.

Second tier 200 includes substrate 222. In some embodiments, substrate 222 is a semiconductor substrate, such as a silicon substrate, although it may be formed of other semiconductor materials. When formed of a semiconductor, substrate 222 may also be a bulk substrate or an STI substrate. In alternative embodiments, substrate 222 is a dielectric substrate. In some embodiments, active devices 224 are formed at surface 222a of substrate 222. In alternative embodiments, no active devices are formed at the surfaces of substrate 222. Active devices 224, when formed, also include transistors, diodes, or the like, wherein a transistor is schematically illustrated in integrated circuits 224.

Interconnect structure 226 is formed over substrate 222. Interconnect structure 226 may include ILD 228 (in which the electrodes of transistors, if any, are located) and contact plugs 230 in ILD 228, wherein contact plugs 230 may be formed of tungsten or other metallic materials.

Furthermore, interconnect structure 226 include IMDs 234, and metal lines/pads 238 and vias 240 in IMDs 234. IMDs 234 may be formed of low-k dielectric materials having low k values that are, for example, lower than about 2.5, or even lower than about 2.0. IMDs 234 may also include non-low-k dielectric layer(s), high-k dielectric layer(s), and/or the like. Interconnect structure 226 may include a bottom metal layer (M1) and a top metal layer Mk (with k being a positive integer), and a plurality of metal layers therebetween, including metal layers M2, M3, M4, etc, all the way to Mk. Metal vias 240 interconnect metal layers M1 through Mk. Positive integer k may also be any positive value ranging, for example, from 3 to 10 or greater, depending on how many layers are needed. Metal lines/pad 238 and vias 240 may be electrically coupled to semiconductor devices 224, if any. Furthermore, metal lines/pad 238 and vias 240 may be electrically coupled to metal lines/pad 138 and vias 140 and semiconductor devices 124 in first tier 100. Metal lines/pad 238 and vias 240 may be formed of copper, aluminum, or the like.

Second tier 200 may further include one or more passivation layer(s) 242 that is over top metal layer Mj. Passivation layer 242 is a non-low-k dielectric layer having a k value equal to or greater than about 3.8 (the k value of silicon oxide), and may be formed of silicon oxide, silicon nitride, un-doped silicate glass, polyimide, or the like. Furthermore, metal pads 246 may be formed under passivation layer 242, wherein passivation layer 242 may cover parts of metal pads 246. In some embodiments, metal pads 246 include aluminum, aluminum copper, or the like. Metal pads 246 may be electrically coupled to metal lines/pad 238 and vias 240, and metal lines/pad 138 and vias 140. Polymer layer 248 may be formed to cover edge portions of metal pads 246 either. Polymer layer 248 may comprise polyimide, polybenzoxazole (PBO), for example.

Post-passivation interconnect (PPI) 250 is formed, wherein PPI 250 includes a first portion over polymer layer 248, and a second portion extending into the opening in passivation layer 242 and polymer layer 248. The second portion of PPI 250 is electrically coupled to, and may contact, metal pads 246. Polymer layer 252 may be formed over PPI 250. Under bump metallurgies (UBMs) 254 may be formed to extend into the openings in polymer layer 252, wherein UBMs 254 are electrically coupled to PPI 250, and may contact the pads in PPI 250. Electrical connectors 256 are formed over UBMs 254. In some embodiments, electrical connectors 256 are solder balls. Electrical connectors 256 are also electrically coupled to metal lines/pad 238 and vias 240, and metal lines/pad 138 and vias 140.

In alternative embodiments, the electrical connections such as solder balls and UBMs that lead to outside of chip 20 are formed underlying first tier 100, instead of formed over second tier 200. In these embodiments, the electrical connections may be electrically coupled to tier 100 and 200 through the through-vias (not shown) penetrating through substrate 122.

The devices and electrical connections of first tier 100 and second tier 200 are electrically interconnected through through-vias 258, which penetrate through substrate 222 to land on the metal pads 140 in top metal layer Mj.

In some embodiments, first tier 100 includes active devices 124, and does not include passive devices such as resistors, capacitors, inductors, transformers, transmission lines, and the like. The passive devices, instead, are formed in second tier 200. Interconnect structure 126 in first tier 100 is thus optimized for improving the performance of active devices. Interconnect structure 226 in second tier 200, on the other hand, is optimized for improving the performance of passive devices (referring to FIG. 3). The details are discussed hereafter referring to FIGS. 2 and 3.

Figure 2:
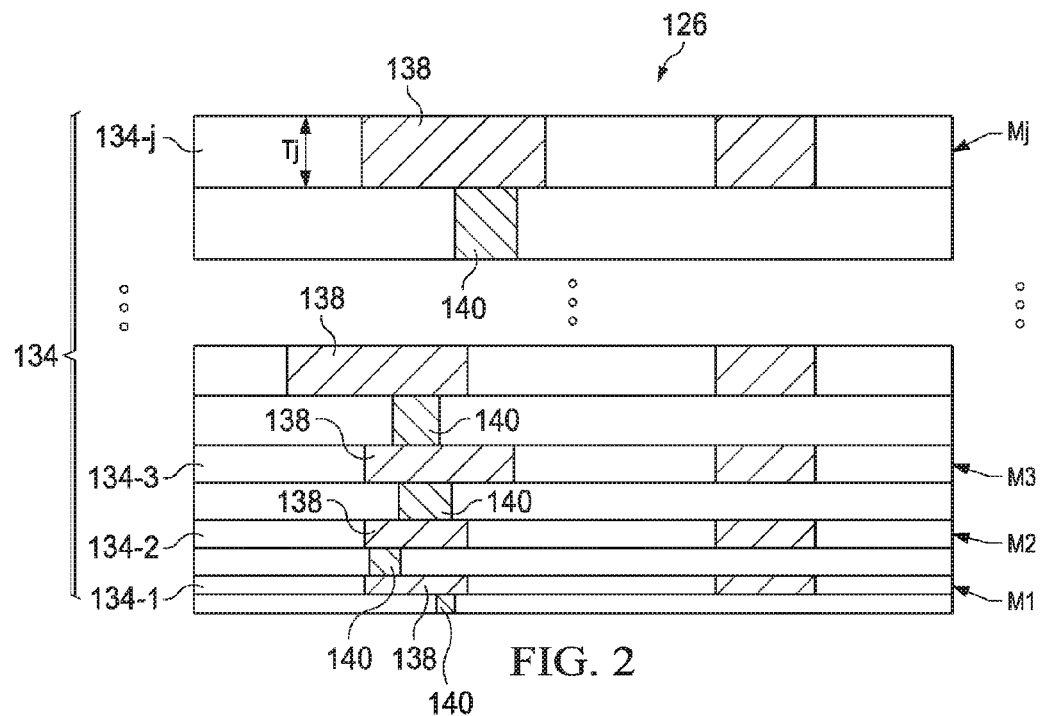
FIG. 2 illustrates the cross-sectional view of the metal layers in the first tier of the two-tier chip in accordance with exemplary embodiments.

FIG. 2 illustrates a schematic cross-sectional view of interconnect structure 126. Referring to FIG. 2, interconnect structure 126 includes a plurality of dielectric layers 134, which are referred to using reference numbers ranging from 134-1 through 134-j, wherein each of dielectric layers includes the respective metal lines M1 through Mj therein. In some embodiments, at least the lower layers of dielectric layers 134 are formed of low-k dielectric materials having k values lower than about 3, for example. On the other hand, dielectric layer 134-j or some other upper dielectric layers such as 134-(j-1) (not shown), 134-(j-2) (not shown), or the like, may be formed of low-k dielectric materials or non-low-k dielectric material with k value equal to or higher than about 3.8. Furthermore, dielectric layers 134 may not include any organic material such as polymer, although organic materials may be used.

In some embodiments, each of the upper ones of metal layers and the respective dielectric layers 134 have a thicknesses (such as Tj, T(j-1), T(j-2)) greater than the thicknesses of all underlying metal layers and dielectric layers. The thicknesses of dielectric layers 134 are equal to the thicknesses of the respective metal lines formed therein. In alternative embodiments, a metal layer and the respective dielectric layer 134 has a thickness equal to the thickness of its immediate underlying metal layer and dielectric layer. No metal layer, however, has a thickness greater than the thickness of its overlying metal layers. With such a hierarchical structure, the parasitic capacitance of the metal lines may be reduced since the metal lines in lower metal layers typically have higher densities, and are closer to each other.

Figure 3:
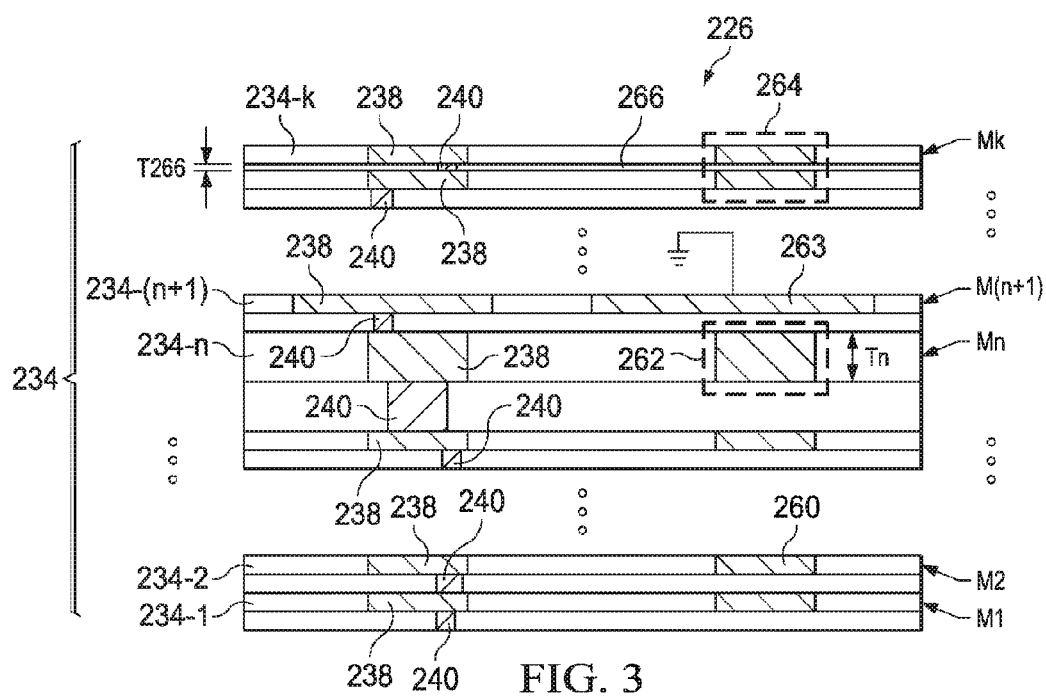
FIG. 3 illustrates the cross-sectional view of the metal layers in the second tier of the two-tier chip in accordance with exemplary embodiments.

FIG. 3 illustrates a schematic cross-sectional view of interconnect structure 226. Referring to FIG. 3, interconnect structure 226 includes a plurality of dielectric layers 234, which are referred to using reference numbers ranging from 234-1 through 234-k, wherein each of dielectric layers includes the respective metal layers M1 through Mk therein. The k values and the thicknesses of dielectric layers 234 and the respective metal layers are optimized for the performance optimization of passive devices formed therein. For example, passive devices 260, 262, and 264 may be formed, and may include resistors, capacitors, inductors, transformers, transmission lines, and the like. In some embodiments, the lower ones (such as 234-1, 234-2, or some overlying layers) of dielectric layers 234 are formed of low-k dielectric material having k values lower than about 3, for example. In alternative embodiments, the lower layers (such as 234-1, 234-2, or some overlying layers) of dielectric layers 234 are formed of non-low-k dielectric materials.

The thicknesses of dielectric layers 234 (and the thicknesses of the respective metal layers M1 through Mk) are not necessarily arranged to increase from lower layers to upper layers. Rather, the thicknesses of the metal layers and the k values of dielectric layers 234 are selected depending on what types of passive devices are formed therein. In some embodiments, metal layer Mn has a greatest thickness Tn among all metal layers in first tier 100 and second tier 200, wherein integer n may be any positive integer between, and including 1 and integer k. Accordingly, when metal layer Mn is an intermediate metal layer, it has a thickness greater than the thickness of all of its overlying metal layers such as M(n+1), M(n+2) (not shown), and the like. Thick metal layer Mn is adapted for forming inductors, transformers, transmission lines, etc, which prefer high Q values. Since the metal features in thick layer Mn have small resistance values, the Q values of the respective passive devices are high. With a very thick metal layer Mn, inductors, transformers, transmission lines, and the like (illustrated as 262) may be formed in metal layer Mn. In accordance with some embodiments, the thickness Tn of metal layer Mn is at least 20 times the thicknesses of all rest of the metal layers in first tier 100 and second tier 200.

Over metal layer Mn, there may be a shielding layer, which is schematically illustrated as layer M(n+1), which includes a plurality of metal pads 263 that is electrically grounded. Metal pads 263 may shield the electro-magnetic interference between the underlying layers/devices in chip 20 (FIG. 1) and external devices outside chip 20.

FIG. 3 also illustrates that second tier 200 includes capacitor 264, which may be a Metal-Insulator-Metal (MIM) capacitor in some embodiments. Dielectric layer 266 is located between the two capacitor plates of capacitor 264. Dielectric layer 266 may have a very small thickness T266, which may be smaller than any of the thickness of the underlying dielectric layers 234 and 134. Furthermore, dielectric layer 266 may have a high k value, for example, higher than about 7, or higher than about 20. Dielectric layer 266 may be formed of hafnium oxide, zirconium oxide, or the like. Since the capacitance of capacitor 264 is proportional to the k value and inversely proportional to thickness T266 of the insulator, the capacitance of capacitor 264 may be very high. In alternative embodiments, capacitor 264 is a Metal-Oxide-Metal (capacitor), which includes a plurality of inter-locked fingers, with dielectric materials disposed between the fingers. Again, the dielectric materials and the respective metal layers in which capacitor 264 is resided may have small thicknesses and/or high k values to increase the capacitance of the capacitor. Although the high-k dielectric layer 266 is illustrated as being formed in an upper layer in dielectric layers 234, it may also be disposed in any other lower layers. For example, the high-k dielectric layer 266 may be disposed underlying a low-k dielectric layer, and may be disposed underlying thick metal layer Mn in some embodiments.

Figure 4:
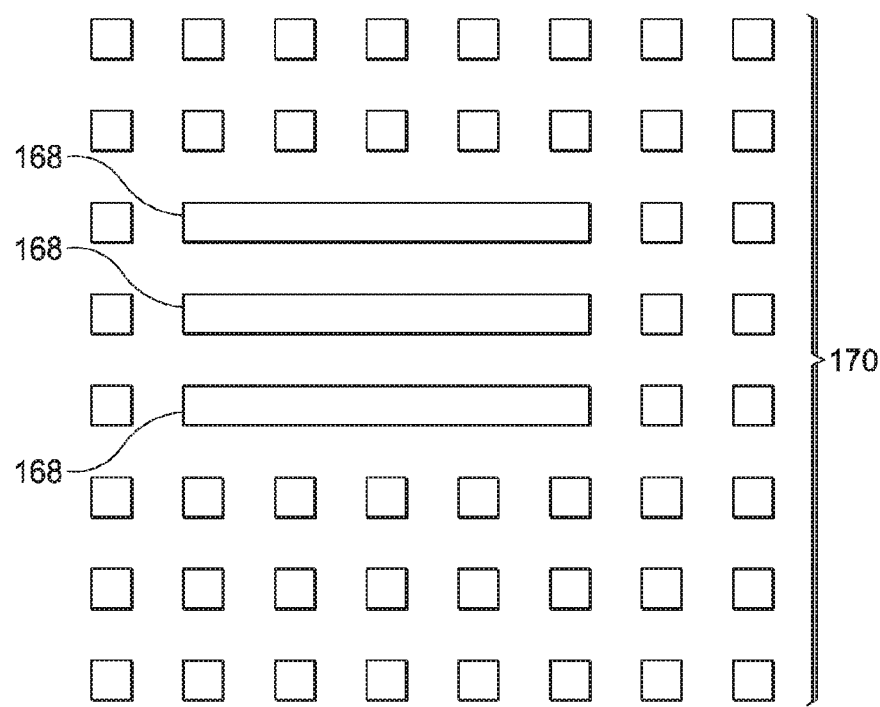
FIG. 4 illustrates a top view of a layer in the first tier in accordance with exemplary embodiments, wherein the layer is used for forming polysilicon features.
Figure 5:
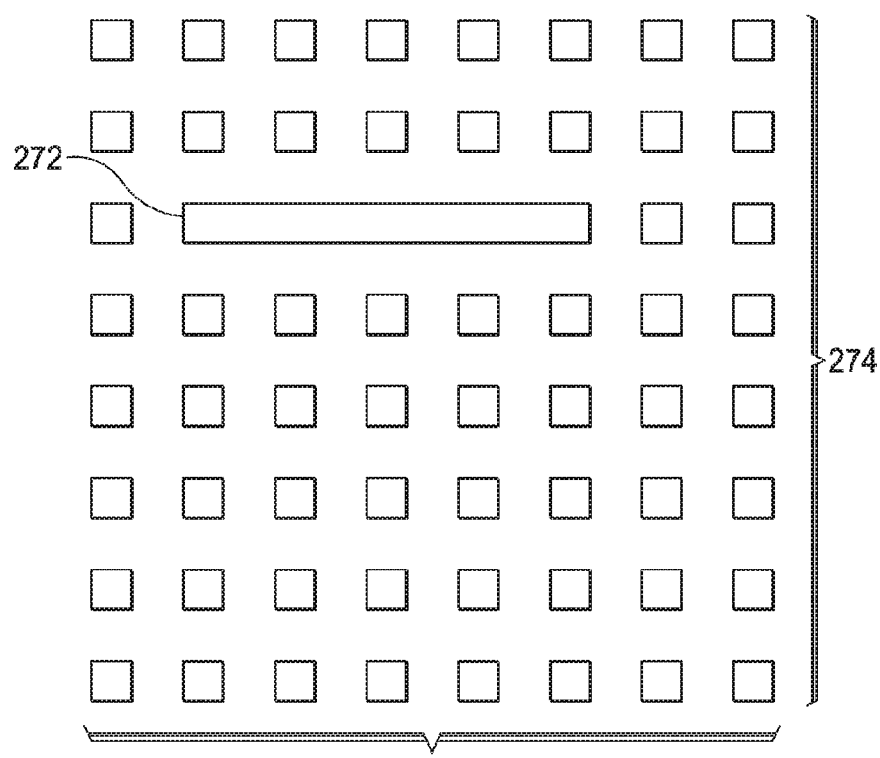
FIG. 5 illustrates a top view of a layer in the second tier in accordance with exemplary embodiments, wherein the layer is used for forming resistors.

FIGS. 4 and 5 schematically illustrate the separation of resistors and polysilicon features into different tiers. Referring to FIG. 4, polysilicon features 168 and dummy polysilicon features 170 are formed, which may be located in ILD 128 (FIG. 1). Polysilicon features 168 may be, for example, the gate electrodes of transistors. Dummy polysilicon features 170 are formed simultaneously when polysilicon features 168 are formed, and are formed for reducing the pattern loading effect. In some embodiments, in the same layer in which features 168 and 170 are formed, no resistor is formed.

Referring to FIG. 5, resistors 272 and dummy features 274 are formed, which may be in second tier 200 (FIG. 1). Resistors 272 may be formed, for example, using titanium nitride or the like. Dummy features 274 are formed simultaneously when resistors 272 are formed, and are formed for reducing the pattern loading effect. In the same layer in which features 272 and 274 are formed, no polysilicon features are formed.

In conventional structures, resistors and polysilicon features were formed in the same layer such as in the ILD of the respective die. Since resistors and polysilicon features are formed of different materials, it was difficult to uniformly distribute the respective dummy features, and the pattern loading effect was difficult to control. In the embodiments of the present disclosure, since passive devices and active devices are separated into different tiers, resistors and polysilicon features may also be separated into different tiers easily, and hence the dummy patterns may be distributed uniformly.

Figure 6:
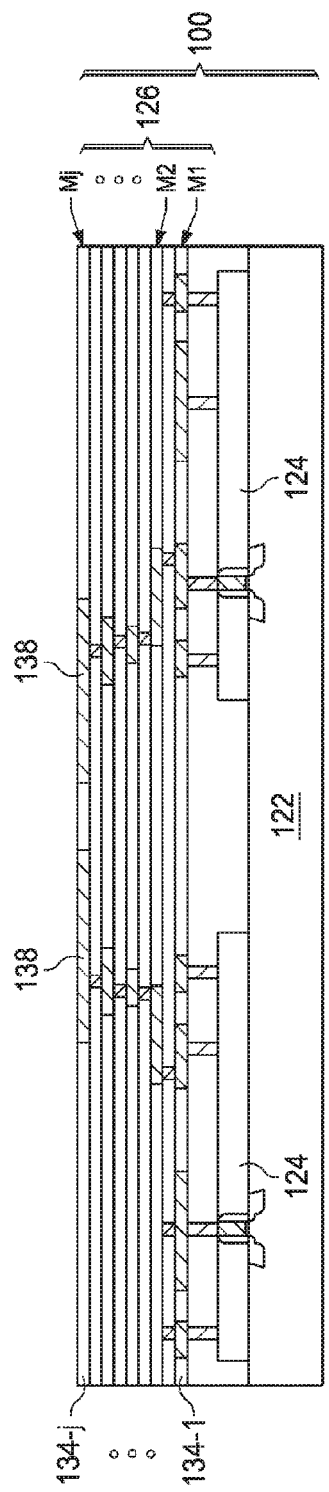
FIGS. 6 through 8 illustrate the cross-sectional views of intermediate stages in the formation of a two-tier chip in accordance with some embodiments.
Figure 7:
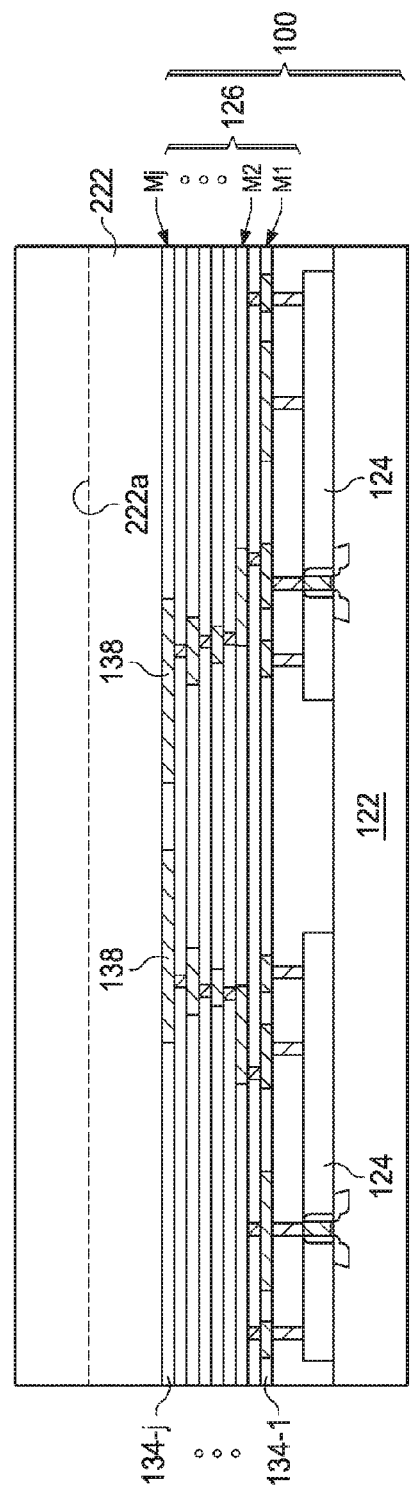
Figure 8:
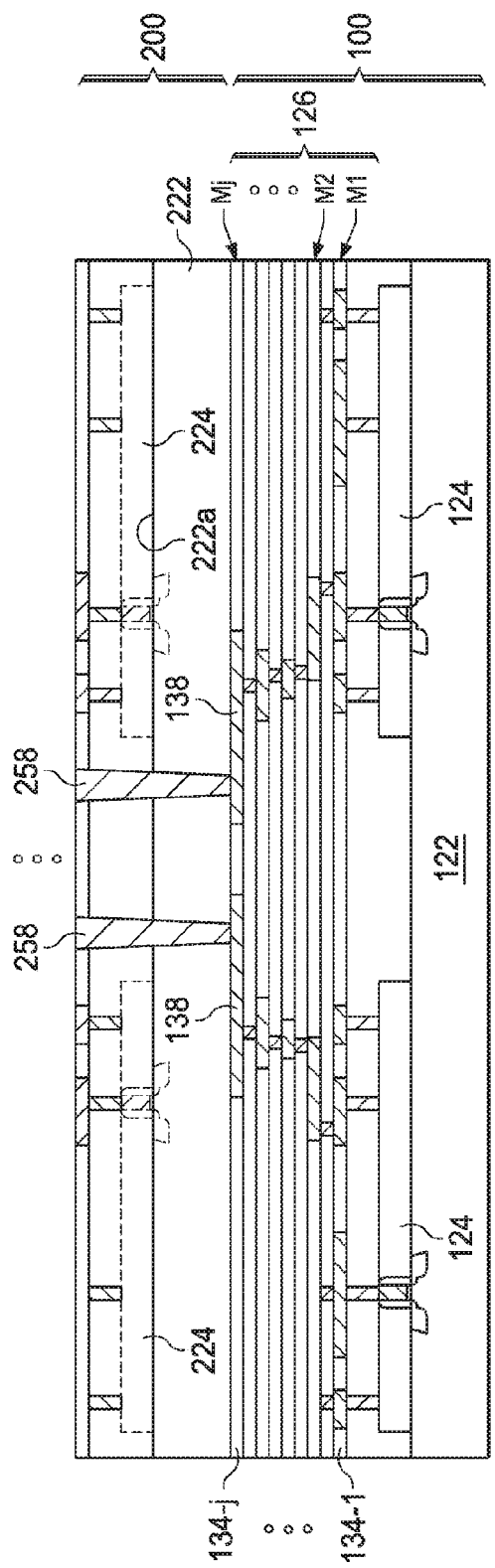

FIGS. 6 through 8 illustrate intermediate stages in the formation of a two-tier die in accordance with some embodiments. Referring to FIG. 6, integrated circuits 124 and interconnect structure 126 are first formed on substrate 122. Next, as shown in FIG. 7, blank semiconductor substrate 222 is bonded on interconnect structure 126. Blank semiconductor substrate 222, when bonded, does not include any metal features and active devices and passive device therein. The bonding may be performed through silicon-to-oxide bonding, oxide-to-oxide bonding, or the like. In the embodiments wherein silicon-to-oxide bonding is performed, substrate 122 may be bonded to dielectric layer 134-j. In the embodiments the oxide-to-oxide bonding is performed, an oxide may be formed at the bottom of substrate 122 in order to perform the bonding.

Next, as also shown in FIG. 7, blanket semiconductor substrate 222 is thinned to a level marked as 222a. In some embodiments, the thinning of substrate 222 includes grinding. Alternatively, blank substrate 222 is implanted with hydrogen to a desirable depth, and then performing an ion cut to remove the hydrogen-implanted layer. As a result, the portion of substrate 222 over the hydrogen-implanted layer is also removed, and substrate 222 is thinned.

Next, devices 224, through-vias 258, and the overlying structures are formed in and over the blanket substrate 222, as shown in FIG. 8. Interconnect structure 226 and the overlying structures are then formed, and the resulting two-tier chip 20 is shown in FIG. 1. Since two-tier chip 20 is not formed through bonding two already-formed chips, there is no metal-to-metal direct bonding, solder bonding, or the like, between tiers 100 and 200. Throughout the description, the term "metal-to-metal direct bonding" refers to the bonding of two metal pads through the inter-diffusion of the metals in two metals pads.

The embodiments of the present disclosure have some advantageous features. Since the k values and the thicknesses of the dielectric layers and metal layers in second tier 200 do not need to be optimized according to the requirement of the active devices in first tier 100, the k values and the thicknesses of the dielectric layers and metal layers in second tier 200 may be customized according to the preference of the passive devices in second tier 200. Accordingly, both the requirement of the active devices and the passive devices in the two-tier chip may be satisfied, and the performance of both active devices and passive devices may be improved.

In accordance with some embodiments, an integrated circuit structure includes a two-tier die including a first tier and a second tier over and bonded to the first tier. The first tier includes a first substrate including a semiconductor material, an active device at a surface of the first substrate, and a first interconnect structure over the first substrate, wherein the first tier is free from passive devices therein. The second tier includes a second substrate bonded to and in contact with the first interconnect structure, and a second interconnect structure over the second substrate, wherein metal lines in the second interconnect structure are electrically coupled to the first interconnect structure. The second tier further includes a plurality of through-vias penetrating through the second substrate, wherein the plurality of through-vias lands on metal pads in a top metal layer of the first interconnect structure, and a passive device in the second interconnect structure. The second tier of the two-tier die may include, or may be free from, active devices therein.

In accordance with other embodiments, an integrated circuit structure includes a first tier and a second tier bonded to the first tier. The first tier includes a first semiconductor substrate, an active device at a surface of the first semiconductor substrate, and a first interconnect structure over the first semiconductor substrate. The first tier is free from passive devices therein. The second tier includes a second semiconductor substrate over and bonded to the first interconnect structure, and a plurality of through-vias landing on metal pads, wherein the metal pads are in a top metal layer of the first interconnect structure. The second tier further includes a second interconnect structure over the second semiconductor substrate, wherein metal lines in the second interconnect structure are electrically coupled to the plurality of through-vias. A plurality of passive devices is formed in the second interconnect structure. The second tier may include, or may be free from, active devices therein.

In accordance with yet other embodiments, a method includes forming a first tier of a two-tier chip. The step of forming the first tier includes forming first active devices at a surface of a semiconductor substrate, and forming a first interconnect structure over the semiconductor substrate. The first tier is free from passive devices therein. The method further includes bonding a substrate of a second tier of the two-tier chip over the first interconnect structure, forming a plurality of through-vias landing on metal pads in a top metal layer of the first interconnect structure, forming a second interconnect structure over the second semiconductor substrate, and forming a plurality of passive devices in the second interconnect structure. The second tier may include, or may be free from, active devices therein.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   forming a first-tier chip comprising:
      forming first active devices at a surface of a semiconductor substrate; and
      forming a first interconnect structure over the semiconductor substrate, wherein the first-tier chip is free from passive devices therein;
   bonding an additional substrate over the first interconnect structure;
   after the bonding the additional substrate, thinning the additional substrate;
   after the thinning the additional substrate, forming a plurality of through-vias penetrating through the additional substrate, wherein the plurality of through-vias lands on metal pads in a top metal layer of the first interconnect structure;
   forming a second interconnect structure over the additional substrate; and
   forming a plurality of passive devices in the second interconnect structure, wherein the additional substrate, the plurality of through-vias, the second interconnect structure, and the plurality of passive devices in combination form a second-tier chip.

2. The method of claim 1 further comprising forming electrical connectors over, and electrically coupling to, the second interconnect structure.

3. The method of claim 1 further comprising forming second active devices at a surface of the additional substrate.

4. The method of claim 1, wherein no active device exists at surfaces of the additional substrate after the second interconnect structure is formed.

5. The method of claim 4, wherein the additional substrate is an additional semiconductor substrate.

6. The method of claim 4, wherein the additional substrate is a dielectric substrate.

7. The method of claim 1, wherein:
   the first-tier chip comprises a first plurality of low-k dielectric layers, with upper ones of the first plurality of low-k dielectric layers being no thinner than lower ones of the first plurality of low-k dielectric layers; and
   the second-tier chip comprises a second plurality of low-k dielectric layers, with an upper one of the second plurality of low-k dielectric layers being thinner than a lower one of the second plurality of low-k dielectric layers.

8. The method of claim 1, wherein the forming the plurality of passive devices in the second interconnect structure comprises forming a passive device in a thickest dielectric layer in the second interconnect structure.

9. The method of claim 8 further comprising forming a metal pad covering the passive device.

10. The method of claim 9 further comprising grounding the metal pad.

11. A method comprising:
    bonding a dielectric substrate to a dielectric layer of a chip, wherein the chip comprises:
       a semiconductor substrate;
       active devices at a surface of the semiconductor substrate;
       a first interconnect structure over the semiconductor substrate, wherein the dielectric layer is a top one of the first interconnect structure;
    thinning the dielectric substrate;
    forming a plurality of through-vias penetrating through the dielectric substrate that is thinned, wherein the plurality of through-vias is in contact with metal pads in the dielectric substrate that is thinned;

forming a second interconnect structure over the dielectric substrate that is thinned; and forming a plurality of passive devices in the second interconnect structure.

12. The method of claim 11, wherein the chip is free from passive devices therein.

13. The method of claim 11, wherein the forming the second interconnect structure comprises forming a plurality of low-k dielectric layers, with an upper one of the plurality of low-k dielectric layers being thinner than a lower one of the plurality of low-k dielectric layers.

14. The method of claim 11, wherein the lower one of the plurality of low-k dielectric layers has one of the plurality of passive devices extending therein, and wherein the one of the plurality of passive devices is selected from the group consisting essentially of an inductor, a transformer, a transmission line, and combinations thereof.

15. The method of claim 14, wherein the forming the second interconnect structure further comprises:

forming a shielding layer over the lower one of the plurality of low-k dielectric layers; and electrically grounding a metal pad in the shielding layer, with the metal pad overlapping the one of the plurality of passive devices.

16. The method of claim 13, wherein the forming the plurality of passive devices comprises forming a capacitor in the upper one of the plurality of low-k dielectric layers.

17. A method comprising:

forming a composite chip comprising:

forming a first-tier chip comprising:

forming active devices at a surface of a first semiconductor substrate; and forming a first interconnect structure over the first semiconductor substrate, wherein the first-tier chip is free from passive devices therein; and forming a second-tier chip comprising:

forming a second interconnect structure over a second semiconductor substrate, wherein the second semiconductor substrate is bonded to the first-tier chip;

forming a plurality of through-vias penetrating through the second semiconductor substrate, wherein the plurality of through-vias comprises bottom ends coplanar with a bottom surface of the second semiconductor substrate, with the bottom ends in contact with metal pads of the first-tier chip; and forming a plurality of passive devices in the second interconnect structure.

18. The method of claim 17, wherein the forming the second-tier chip comprises:

bonding the second semiconductor substrate as a blank substrate to the first-tier chip; and thinning the blank substrate, with the plurality of through-vias formed in the blank substrate that is thinned.

19. The method of claim 17, wherein:

the first interconnect structure comprises a first plurality of low-k dielectric layers, with upper ones of the first plurality of low-k dielectric layers being no thinner than lower ones of the first plurality of low-k dielectric layers; and the second interconnect structure comprises a second plurality of low-k dielectric layers, with an upper one of the second plurality of low-k dielectric layers being thinner than a lower one of the second plurality of low-k dielectric layers.

20. The method of claim 17, wherein no active device is formed at surfaces of the second semiconductor substrate.

* * * * *